(12) United States Patent
Chae et al.

(10) Patent No.: US 7,300,084 B2
(45) Date of Patent: Nov. 27, 2007

(54) APPARATUS FOR CONVEYING LIQUID CRYSTAL DISPLAY PANEL

(75) Inventors: Kyung-Su Chae, Daegu (KR); Jong-Go Lim, Kyoungsangbok-do (KR)

(73) Assignee: L.G.Philips LCD Co., Ltd., Seoul (KR)

( * ) Notice: Subject to any disclaimer, the term of this patent is extended or adjusted under 35 U.S.C. 154(b) by 115 days.

(21) Appl. No.: 10/330,434

(22) Filed: Dec. 30, 2002

(65) Prior Publication Data

US 2003/0178866 A1    Sep. 25, 2003

(30) Foreign Application Priority Data

Mar. 23, 2002  (KR) .................... 10-2002-0015871

(51) Int. Cl.
*B25J 15/08* (2006.01)

(52) U.S. Cl. ................... 294/119.1; 414/751.1; 901/38

(58) Field of Classification Search ............ 294/119.1; 414/741, 751.1, 744.8, 941; 901/36, 38
See application file for complete search history.

(56) References Cited

U.S. PATENT DOCUMENTS

| | | | |
|---|---|---|---|
| 3,978,580 A | 9/1976 | Leupp et al. | |
| 4,094,058 A | 6/1978 | Yasutake et al. | |
| 4,579,380 A * | 4/1986 | Zaremsky et al. | 294/119.1 |
| 4,653,864 A | 3/1987 | Baron et al. | |
| 4,680,523 A * | 7/1987 | Goumas et al. | 318/685 |
| 4,691,995 A | 9/1987 | Yamazaki et al. | |
| 4,775,225 A | 10/1988 | Tsuboyama et al. | |
| 5,100,285 A * | 3/1992 | Wagner | 414/744.8 |
| 5,127,695 A * | 7/1992 | Zoeten | 294/67.33 |
| 5,186,515 A * | 2/1993 | Goldberg et al. | 294/119.1 |
| 5,247,377 A | 9/1993 | Omeis et al. | |
| 5,263,888 A | 11/1993 | Ishihara et al. | |
| 5,379,139 A | 1/1995 | Sato et al. | |
| 5,406,989 A | 4/1995 | Abe | |
| 5,499,128 A | 3/1996 | Hasegawa et al. | |
| 5,507,323 A | 4/1996 | Abe | |
| 5,511,591 A | 4/1996 | Abe | |
| 5,539,545 A | 7/1996 | Shimizu et al. | |
| 5,548,429 A | 8/1996 | Tsujita | |
| 5,609,381 A * | 3/1997 | Thom et al. | 294/119.1 |
| 5,642,214 A | 6/1997 | Ishii et al. | |
| 5,680,189 A | 10/1997 | Shimizu et al. | |
| 5,700,046 A * | 12/1997 | Van Doren et al. | 294/119.1 |
| 5,742,370 A | 4/1998 | Kim et al. | |

(Continued)

FOREIGN PATENT DOCUMENTS

EP    1 003 066 A1  A1    5/2000

(Continued)

*Primary Examiner*—Dean J. Kramer
(74) *Attorney, Agent, or Firm*—McKenna Long & Aldridge LLP

(57) ABSTRACT

An apparatus for convening a liquid crystal display panel for moving various size unit liquid crystal display panels. The present invention includes a horizontal driving unit controlling a revolution of a motor, a plurality of screw shafts protruding out of the horizontal driving unit. A pair of robot arms having first and second ends, the first ends are supported by corresponding screw shafts and extend from the screw shafts, and a plurality of clamping units connected to the second ends of the robot arms.

23 Claims, 13 Drawing Sheets

U.S. PATENT DOCUMENTS

| | | | |
|---|---|---|---|
| 5,757,451 A | 5/1998 | Miyazaki et al. |
| 5,852,484 A | 12/1998 | Inoue et al. |
| 5,854,664 A | 12/1998 | Inoue et al. |
| 5,861,932 A | 1/1999 | Inata et al. |
| 5,875,922 A | 3/1999 | Chastine et al. |
| 5,952,676 A | 9/1999 | Sato et al. |
| 5,956,112 A | 9/1999 | Fujimori et al. |
| 6,001,203 A | 12/1999 | Yamada et al. |
| 6,011,609 A | 1/2000 | Kato et al. |
| 6,016,178 A | 1/2000 | Kataoka et al. |
| 6,016,181 A | 1/2000 | Shimada |
| 6,055,035 A | 4/2000 | von Gutfeld et al. |
| 6,163,357 A | 12/2000 | Nakamura |
| 6,219,126 B1 | 4/2001 | von Gutfeld |
| 6,226,067 B1 | 5/2001 | Nishiguchi et al. |
| 6,236,445 B1 | 5/2001 | Foschaar et al. |
| 6,304,306 B1 | 10/2001 | Shiomi et al. |
| 6,304,311 B1 | 10/2001 | Egami et al. |
| 6,337,730 B1 | 1/2002 | Ozaki et al. |
| 6,414,733 B1 | 7/2002 | Ishikawa et al. |
| 6,474,712 B1 * | 11/2002 | Govzman et al. ........ 294/106 |
| 2001/0021000 A1 | 9/2001 | Egami |

FOREIGN PATENT DOCUMENTS

| | | |
|---|---|---|
| JP | 51-065656 | 6/1976 |
| JP | 57-038414 A1 | 3/1982 |
| JP | 57-088428 A1 | 6/1982 |
| JP | 58-027126 A1 | 2/1983 |
| JP | 59-057221 | 4/1984 |
| JP | 59-195222 | 11/1984 |
| JP | 60-111221 | 6/1985 |
| JP | 60-164723 A1 | 8/1985 |
| JP | 60-217343 A1 | 10/1985 |
| JP | 61-007822 A1 | 1/1986 |
| JP | 61-055625 A1 | 3/1986 |
| JP | S62-054225 | 3/1987 |
| JP | S62-054228 | 3/1987 |
| JP | 62-089025 A1 | 4/1987 |
| JP | 62-090622 A1 | 4/1987 |
| JP | 62-205319 A1 | 9/1987 |
| JP | 63-109413 A1 | 5/1988 |
| JP | 63-110425 A1 | 5/1988 |
| JP | 63-128315 A1 | 5/1988 |
| JP | 63-311233 A1 | 12/1988 |
| JP | H03-009549 | 1/1991 |
| JP | H05-036425 | 2/1993 |
| JP | H05-036426 | 2/1993 |
| JP | H05-107533 | 4/1993 |
| JP | 05-127179 A1 | 5/1993 |
| JP | 05-154923 | 6/1993 |
| JP | 05-265011 A1 | 10/1993 |
| JP | 05-281557 A1 | 10/1993 |
| JP | 05-281562 A1 | 10/1993 |
| JP | 05-301710 | 11/1993 |
| JP | H06-018829 | 1/1994 |
| JP | 06-051256 A1 | 2/1994 |
| JP | H06-064229 | 3/1994 |
| JP | 06-148657 A1 | 5/1994 |
| JP | 06-155354 | 6/1994 |
| JP | 06-160871 | 6/1994 |
| JP | H06-194637 | 7/1994 |
| JP | 06-235925 | 8/1994 |
| JP | 06-265915 A1 | 9/1994 |
| JP | 06-313870 | 11/1994 |
| JP | 07-084268 | 3/1995 |
| JP | 07-128674 A1 | 5/1995 |
| JP | 07-181507 A1 | 7/1995 |
| JP | 07-283589 | 10/1995 |
| JP | H07-275770 | 10/1995 |
| JP | H07-275771 | 10/1995 |
| JP | H08-076133 | 3/1996 |
| JP | 08-095066 A1 | 4/1996 |
| JP | 08-101395 | 4/1996 |
| JP | 08-106101 A1 | 4/1996 |
| JP | H08-110504 | 4/1996 |
| JP | H08-136937 | 5/1996 |
| JP | 08-171094 A1 | 7/1996 |
| JP | 08-190099 A1 | 7/1996 |
| JP | H08-173874 | 7/1996 |
| JP | 08-240807 A1 | 9/1996 |
| JP | 08-297279 | 11/1996 |
| JP | 09-005762 A1 | 1/1997 |
| JP | 09-026578 A1 | 1/1997 |
| JP | H09-001026 | 1/1997 |
| JP | 09-040111 | 2/1997 |
| JP | 09-061829 | 3/1997 |
| JP | 09-073075 A1 | 3/1997 |
| JP | 09-073096 A1 | 3/1997 |
| JP | H09-094500 | 4/1997 |
| JP | 09-127528 A1 | 5/1997 |
| JP | 09-230357 A1 | 9/1997 |
| JP | 09-281511 A1 | 10/1997 |
| JP | 09-311340 A1 | 12/1997 |
| JP | 10-068918 | 3/1998 |
| JP | 10-123537 A1 | 5/1998 |
| JP | 10-123538 A1 | 5/1998 |
| JP | 10-142616 A1 | 5/1998 |
| JP | 10-177178 | 6/1998 |
| JP | H10-174924 | 6/1998 |
| JP | 10-221700 A1 | 8/1998 |
| JP | 10-282512 A1 | 10/1998 |
| JP | 10-333157 | 12/1998 |
| JP | 10-333159 | 12/1998 |
| JP | 11-014953 A1 | 1/1999 |
| JP | 11-030234 | 2/1999 |
| JP | 11-038424 A1 | 2/1999 |
| JP | 11-064811 A1 | 3/1999 |
| JP | 11-109388 A1 | 4/1999 |
| JP | 11-133438 | 5/1999 |
| JP | 11-142864 | 5/1999 |
| JP | 11-174477 A1 | 7/1999 |
| JP | 11-212045 A1 | 8/1999 |
| JP | 11-248930 | 9/1999 |
| JP | H11-262712 | 9/1999 |
| JP | H11-264991 | 9/1999 |
| JP | 11-326922 | 11/1999 |
| JP | 11-344714 A1 | 12/1999 |
| JP | 2000-002879 | 1/2000 |
| JP | 2000-029035 | 1/2000 |
| JP | 2000-046747 | 2/2000 |
| JP | 2000-056311 | 2/2000 |
| JP | 2000-066165 | 3/2000 |
| JP | 2000-137235 | 5/2000 |
| JP | 2000-147528 | 5/2000 |
| JP | 2000-193988 | 7/2000 |
| JP | 2000-241824 | 9/2000 |
| JP | 2000-284295 | 10/2000 |
| JP | 2000-292799 | 10/2000 |
| JP | 2000-304087 | 10/2000 |
| JP | 2000-310759 | 11/2000 |
| JP | 2000-310784 | 11/2000 |
| JP | 2000-338501 | 12/2000 |
| JP | 2001-005401 | 1/2001 |
| JP | 2001-005405 | 1/2001 |
| JP | 2001-013506 | 1/2001 |
| JP | 2001-033793 A1 | 2/2001 |
| JP | 2001-042341 | 2/2001 |
| JP | 2001-051284 | 2/2001 |
| JP | 2001-066615 | 3/2001 |
| JP | 2001-091727 | 4/2001 |
| JP | 2001-117105 | 4/2001 |
| JP | 2001-117109 | 4/2001 |
| JP | 2001-133745 | 5/2001 |

| | | | | | | |
|---|---|---|---|---|---|---|
| JP | 2001-133794 | 5/2001 | | JP | 2001-330837 | 11/2001 |
| JP | 2001-133799 | 5/2001 | | JP | 2001-330840 A1 | 11/2001 |
| JP | 2001-142074 | 5/2001 | | JP | 2001-356353 | 12/2001 |
| JP | 2001-147437 | 5/2001 | | JP | 2001-356354 A1 | 12/2001 |
| JP | 2001-154211 | 6/2001 | | JP | 2002-014360 A1 | 1/2002 |
| JP | 2001-166272 | 6/2001 | | JP | 2002-023176 A1 | 1/2002 |
| JP | 2001-166310 | 6/2001 | | JP | 2002-049045 A1 | 2/2002 |
| JP | 2001-183683 | 7/2001 | | JP | 2002-082340 A1 | 3/2002 |
| JP | 2001-209052 | 8/2001 | | JP | 2002-090759 A1 | 3/2002 |
| JP | 2001-209060 | 8/2001 | | JP | 2002-090760 A1 | 3/2002 |
| JP | 2001-222017 | 8/2001 | | JP | 2002-107740 A1 | 4/2002 |
| JP | 2001-235758 | 8/2001 | | JP | 2002-122872 A1 | 4/2002 |
| JP | 2001-215459 | 9/2001 | | JP | 2002-122873 A1 | 4/2002 |
| JP | 2001-255542 | 9/2001 | | JP | 2002-139734 | 5/2002 |
| JP | 2001-264782 | 9/2001 | | JP | 2002-202512 A1 | 7/2002 |
| JP | 2001-201750 | 10/2001 | | JP | 2002-202514 A1 | 7/2002 |
| JP | 2001-272640 | 10/2001 | | JP | 2002-214626 A1 | 7/2002 |
| JP | 2001-281675 | 10/2001 | | JP | 2002-341362 | 11/2002 |
| JP | 2001-281678 | 10/2001 | | KR | 2000-035302 A1 | 6/2000 |
| JP | 2001-282126 | 10/2001 | | | | |
| JP | 2001-305563 | 10/2001 | | * cited by examiner | | |

APPARATUS FOR CONVEYING LIQUID CRYSTAL DISPLAY PANEL

This application claims the benefit of the Korean Patent Application No. P2002-15871 filed on Mar. 23, 2002, which is hereby incorporated by reference for all purposes as if fully set forth herein.

BACKGROUND OF THE INVENTION

1. Field of the Invention

The present invention relates to an apparatus for conveying a liquid crystal display panel. More particularly, the present invention relates to an apparatus for conveying various sizes of unit liquid crystal display panels.

2. Discussion of the Related Art

A liquid crystal display device supplies liquid crystal cells with data signals according to image information, respectively, in order to display the desired image. The liquid crystal cells are arranged in a matrix like configuration and the image is displayed by controlling a light-transmittance of each liquid crystal cells.

A cutting process is performed on the liquid crystal displays, cutting the displays into a unit liquid crystal display panels. Generally, the process includes a scribing process by forming a scribing line on a substrate of a mother substrate with a pen having hardness greater than that of glass. Additionally, the process includes propagating a crack along the scribing line. Such a cutting process of the unit panels is explained in detail by referring to the attached drawings as follows.

FIG. 1 illustrates a cross-sectional view of a first mother substrate having thin film transistor array substrates and a second mother substrate having color filter substrates. The first and second mother substrates are bonded to each other, thereby forming a plurality of liquid crystal display panels.

Referring to FIG. 1, the unit LCD display of the mother substrate 20 has a unit thin film transistor array substrate 1. One side of the thin film transistor array substrate 1 protrudes longer than the corresponding side of the color filter substrate 2. The gate and data pad parts (not shown in the drawing) are formed at the corresponding edges of the thin film transistor array of substrates 1 and do not overlap with the color filter substrates 2.

The color filter substrates 2 on the second mother substrate 30, are spaced apart from each other with a dummy area 31. The dummy area 31 corresponds to the protruding area of each of the thin film transistor array on the first mother substrate 20.

Moreover, the unit liquid crystal display panels are arranged to make best use of the first and second mother substrates 20 and 30. The unit liquid crystal display panels differ from each other according to the various models. The unit liquid crystal display panels are generally formed to separate from each other at the dummy area 32.

After the first and second mother substrates have been bonded together the liquid crystal display panels are individually cut. Simultaneously, the dummy area 31 of each of the color filter substrates 2 and the other dummy area 32 separating the unit liquid crystal display panels from each other are removed.

FIG. 2 illustrates a schematic layout of an individually cut unit liquid crystal display panel according to the related art.

Referring to FIG. 2, an individual unit liquid crystal display panel 10 includes an image display part 13 having liquid crystal cells arranged in a matrix form. A gate pad part 14 connects gate lines GL1–GLm of the image display part 13 to a gate driver integrated circuit (not shown in the drawing) for supplying gate signals. The data pad part 15 connects data lines DL1–DLn of the image display part 13 to a data driver integrated circuit (not shown in the drawing) for supplying image information. The gate pad parts 14 and data pad parts 15 are arranged on the edge of the thin film transistor array of substrate 1.

Thin film transistors are formed at areas where the data lines and gate lines cross each other on substrate 1. The thin film transistors switch the liquid crystal cells and pixel electrodes are connected to the thin film transistors for supplying electric fields to the corresponding liquid crystal cells. A passivation layer is formed on an entire surface to protect the data lines DL1–DLn, gate lines GL1–GLm, thin film transistors, and electrodes.

Color filters are formed on substrate 2. The color filters are separated from an adjacent cell area through a black matrix and a common electrode. The common electrode is a counter electrode of the pixel electrodes on the thin film transistor array substrate 1.

A cell gap is provided for leaving a predetermined interval between the substrates 1 and 2. Substrates 1 and 2 are bonded to each other by a sealing part (not shown in the drawing) that is formed on a periphery of the image display part 13. A liquid crystal layer (not shown in the drawing) is formed in a separating space between substrates 1 and 2.

Additionally, a short circuit line (not shown in the drawing) is formed on an edge of the thin film transistor array of substrate 1. The short circuit line prevents static electricity generated during the patterning of conductive layers from damaging the thin film transistor array of substrate 1. The short circuit line is typically removed after the liquid crystal display panels are cut into individual unit liquid crystal display panels.

For example, after the liquid crystal display panels have been cut into individual unit liquid crystal display panels the edges of the individual unit liquid crystal display panels are grinded to remove the short circuit line. Additionally, the edges are grinded in order to prevent damage from external impact and prevent injury from any sharp edges of the unit liquid crystal display panels that may be present.

Finally, a final testing analysis is performed to determine normal operation of the individual unit liquid crystal display panels. The panels are judged with varying criteria, for example, a 'good product.'

As mentioned in the foregoing explanation, the grinding and checking processes are carried out after the process of cutting the liquid crystal display panels into the individual unit liquid crystal display panels. A conveying apparatus precisely controls this process by transporting the corresponding unit liquid crystal display panel to the desired location. Additionally, the movement via the apparatus is utilized to minimize impact on the panel. An apparatus for conveying the liquid crystal display panel is explained in detail by referring to the attached drawings as follows.

FIG. 3 illustrates a close up view of an apparatus for conveying an individual liquid crystal display panel according to the related art.

Referring to FIG. 3, the apparatus includes a cylinder 53 for driving a pair of pistons 51 and 52 with an air in a back and forth direction. A vertical driving unit 55 for driving the cylinder 53 capable of moving along a conveying shaft 54. A pair of support shafts 56 and 57 connected to pistons 51 and 52. The support shafts protrude on lateral sides of the cylinder 53. A pair of robot arms 58 and 59, each of the arms has on of their ends connected to the support shafts 56 and 57. The robot arms extend in a direction substantially perpendicular to the support shafts 56 and 57. A pair of clamping units 60 and 61 connected to lower portions the ends of the robot arms 58 and 59. The robot arms are separated at a predetermined distance, thereby forming a separating area.

FIGS. 4A to 4D illustrate close up views of an apparatus for conveying an individual unit of a liquid crystal display panel according to the related art.

Referring to FIG. 4A, the cylinder 53 is driven via air injection and discharge, thereby the pistons 51 and 52 move back and forth. Accordingly, the pair of the robot arms 58 and 59 are moved back and forth as the pistons move back and forth. The robot arms can be moved at predetermined intervals from both sides for loading an individual unit liquid crystal display panel 10 on a first table 62. In this case, both of the sides of the loaded unit liquid crystal display panel 10 protrude out of the first table 62.

Referring to FIG. 4B, the vertical driving unit 55 lowers the cylinder 53. The pair of robot arms 58 and 59 are lowered to a level smaller than or at least equal to the level of the individual unit of liquid crystal display panel 10.

Referring to FIG. 4C, the cylinder 53 is driven in a direction of the arrows making the pair of the pistons 51 and 52 get closer to each other through the injection and discharge of air. Accordingly, the pair of the robot arms 58 and 59 are driven in the direction making the robot arms 58 and 59 get closer to each other and are arranged closely to both of the sides of the unit of liquid crystal display panel 10 on the first table 62.

Referring to FIG. 4D, the vertical driving unit 55 elevates the cylinder 53 in the direction of the arrow. Accordingly, the pair of the robot arms 58 and 59 are lifted, thereby elevating the liquid crystal display panel 10 supported by the clamping units 60 and 61.

As mentioned in the above explanation, once the liquid crystal display panel 10 is lifted together with the robot arms 58 and 59 the vertical driving unit 55 is driven to move along the conveying shaft 54. Accordingly, the liquid crystal display panel 10 is transported to the desired location.

Once the liquid crystal display panel 10 has been conveyed to the desired location, it is put down on another table in a reverse manner as explained in FIGS. 4A to 4D, above.

However, the above-explained apparatus according to the related art requires that the robot arms correspond to the size of the liquid crystal display panel that is to be moved. Accordingly, if the size of the liquid crystal display panel to be conveyed is changed the robots arm must be changed. Therefore, the related art apparatus reduces the efficiency of the operation by delaying the process time and thereby reduces the overall productivity.

Additionally, a plurality of robot arms should be prepared to cope with the sizes of the different liquid crystal display panels, thereby the investment cost is increased and additional space for keeping a plurality of the robot arms is required.

SUMMARY OF THE INVENTION

Accordingly, the present invention is directed to an apparatus for conveying a liquid crystal display panel that substantially obviates one or more problems due to limitations and disadvantages of the related art.

An advantage of the present invention is to provide an apparatus for conveying liquid crystal display panels with various sizes.

Additional features and advantages of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an apparatus for conveying a liquid crystal display panel according to the present invention includes a horizontal driving unit controlling a revolution of a motor, a plurality of screw shafts protruding out of the horizontal driving unit. A pair of robot arms having first and second ends, the first ends are supported by corresponding screw shafts and extend from the screw shafts, and a plurality of clamping units connected to the second ends of the robot arms.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiment(s) of the invention and together with the description serve to explain the principle of the invention.

In the drawings.

DETAILED DESCRIPTION OF THE INVENTION

Reference will now be made in detail to the embodiments of the present invention, examples of which are illustrated in the accompanying drawings.

Figure 1:
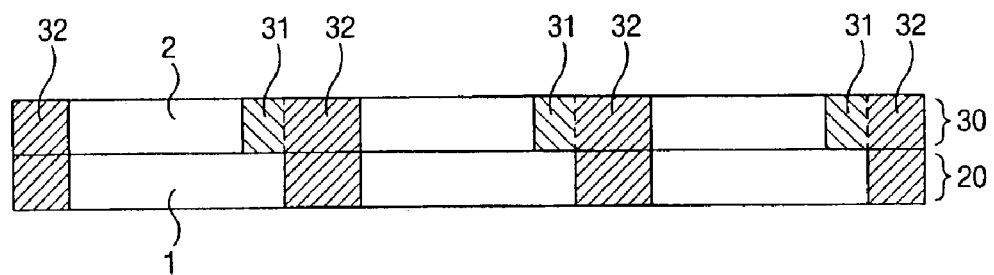
FIG. 1 illustrates a cross-sectional view of a first mother substrate having thin film transistor array substrates and a second mother substrate having color filter substrates, wherein the first and second mother substrates are bonded to each other, thereby forming a plurality of liquid crystal display panels, according to the related art.
Figure 2:
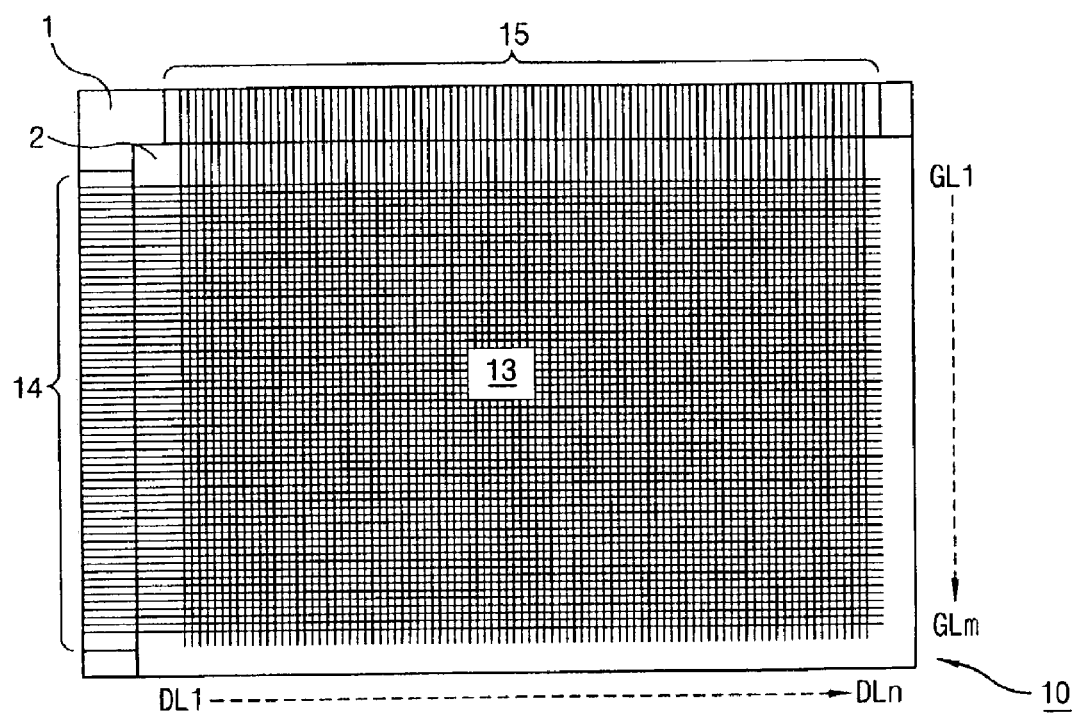
FIG. 2 illustrates a schematic layout of an individually cut unit liquid crystal display panel according to the related art.
Figure 3:
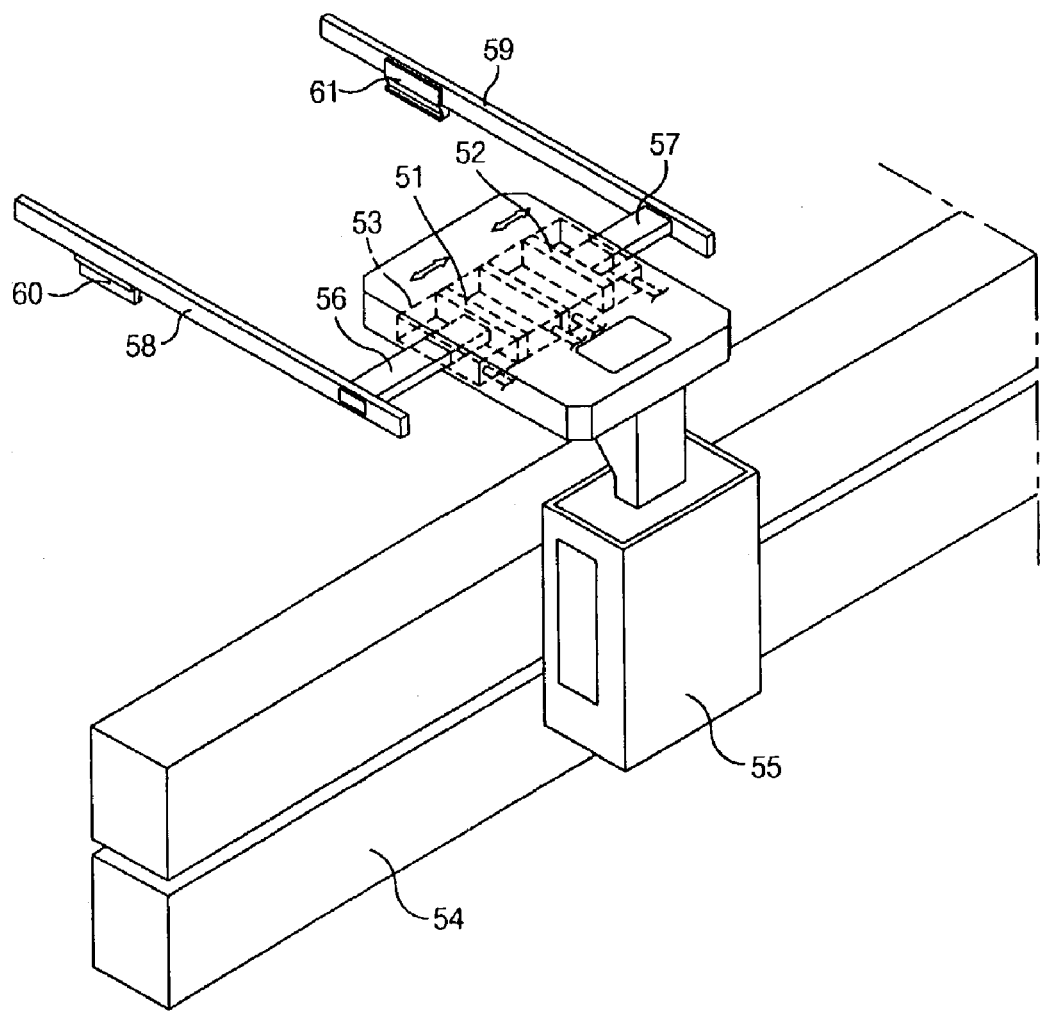
FIG. 3 illustrates a close up view of an apparatus for conveying an individual liquid crystal display panel according to the related art.
Figure 4A:
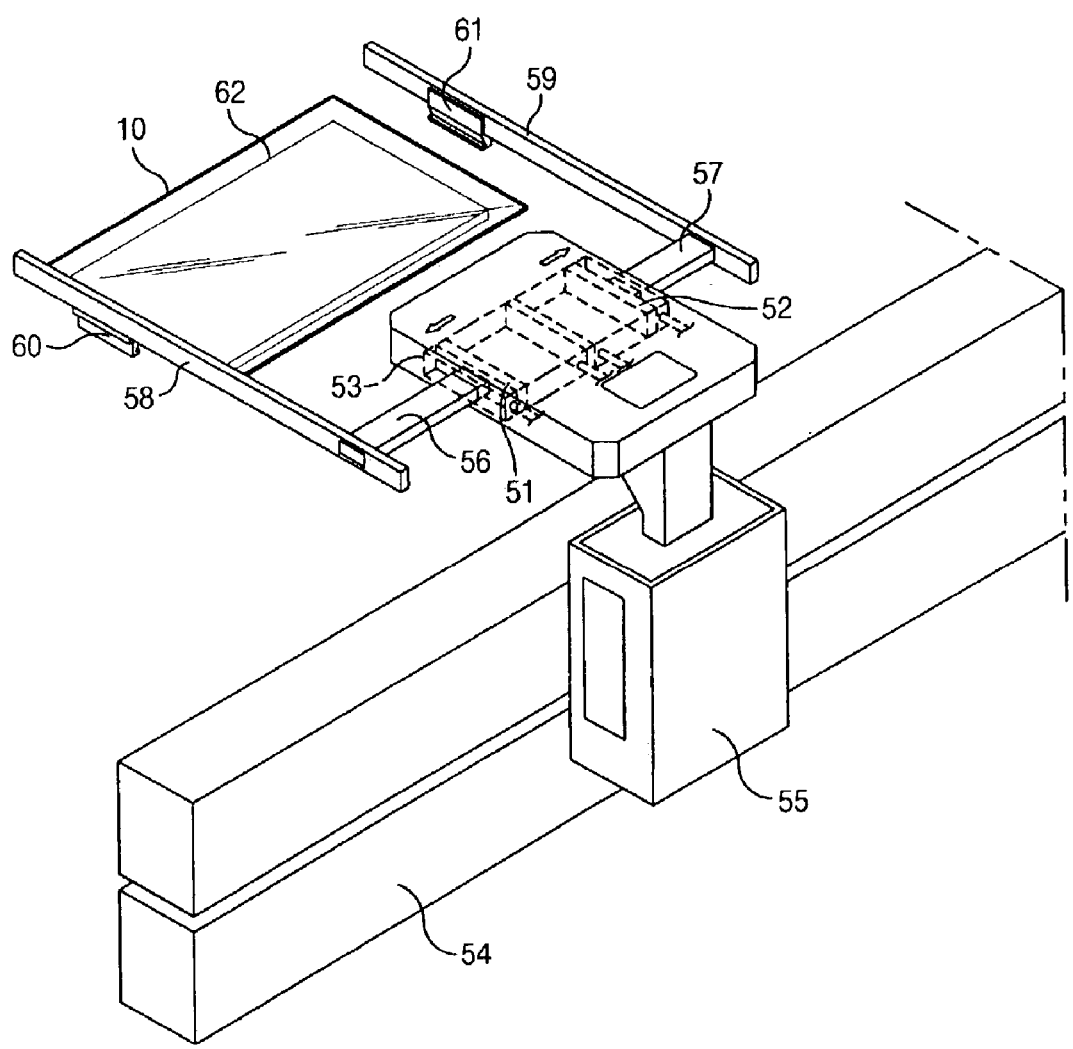
FIGS. 4A to 4D illustrate close up views of an apparatus for conveying an individual unit of a liquid crystal display panel according to the related art for explaining the operation of the apparatus.
Figure 4B:
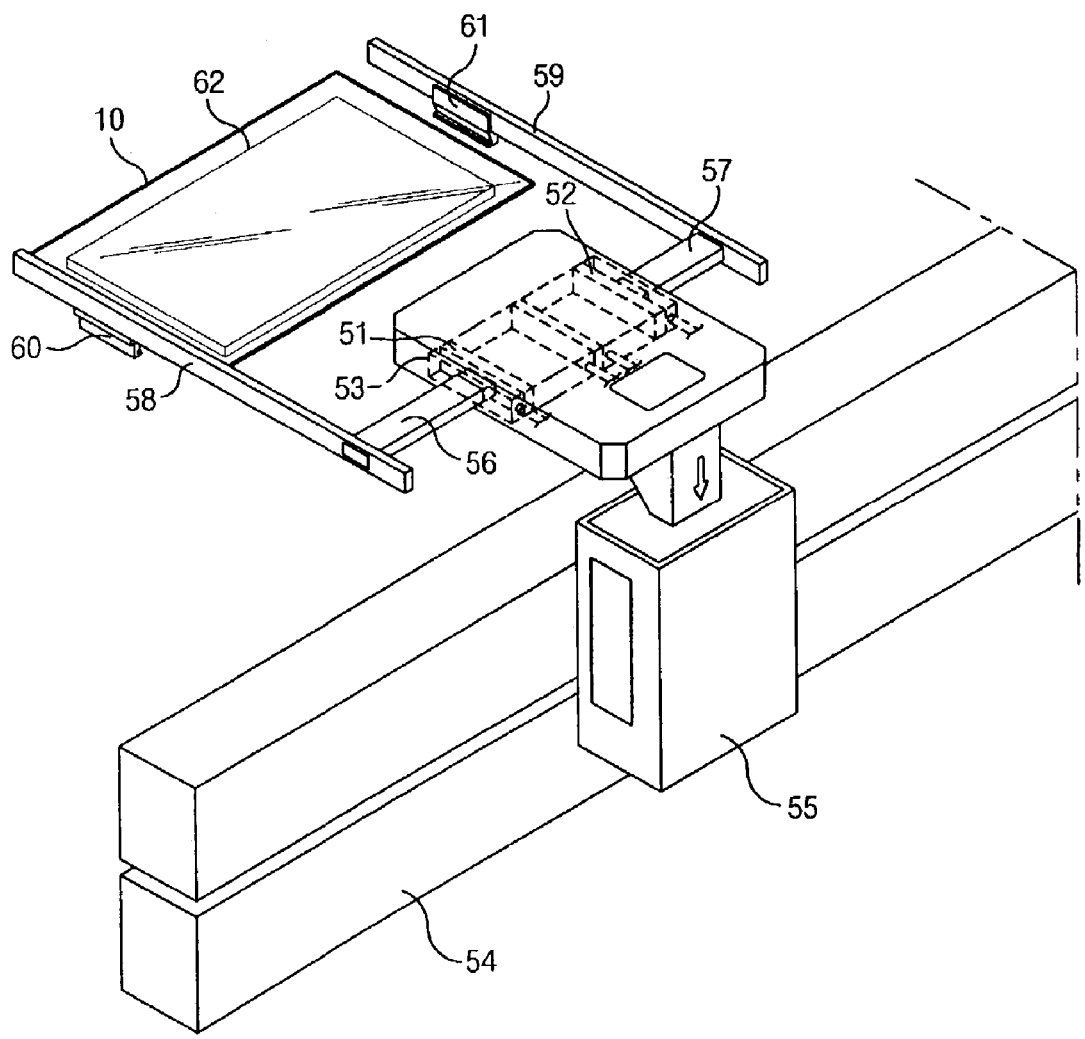
Figure 4C:
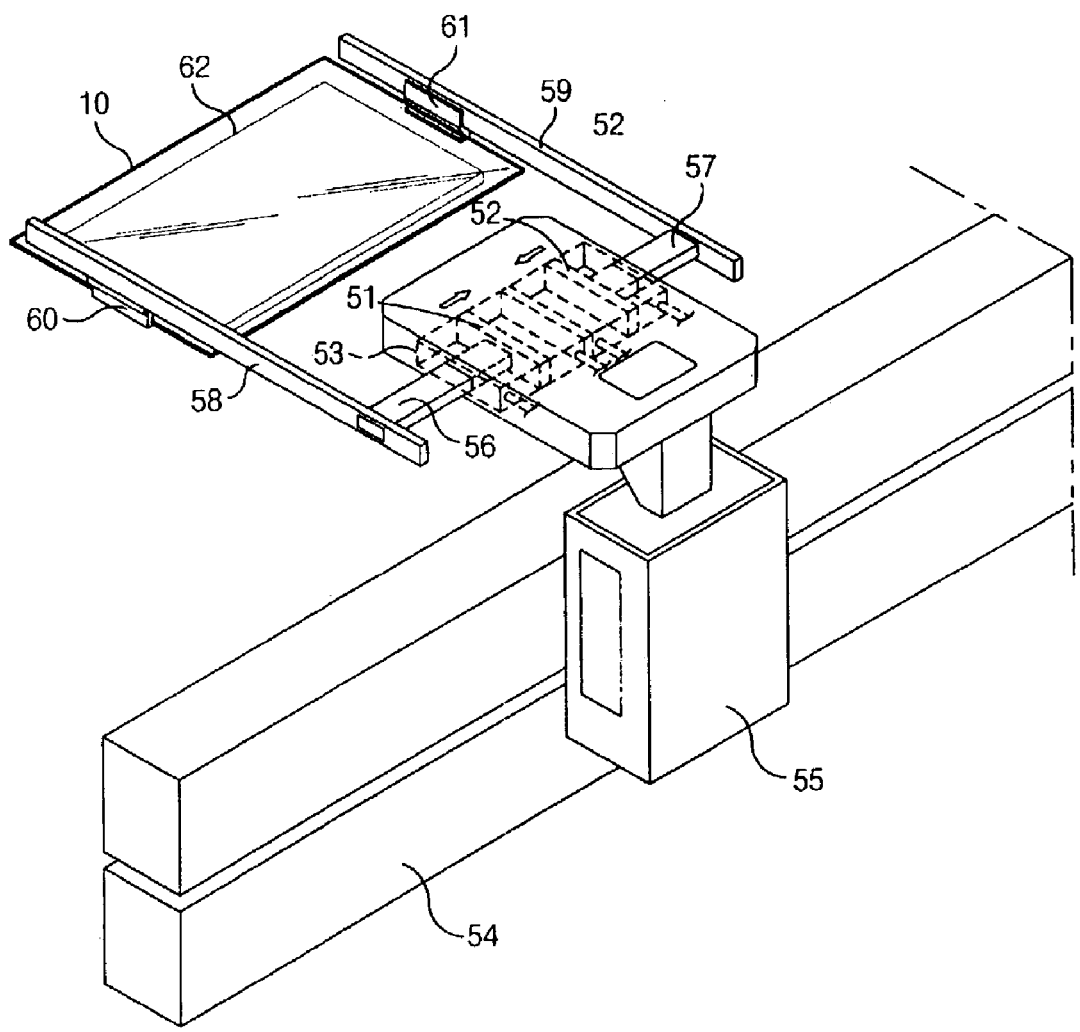
Figure 4D:
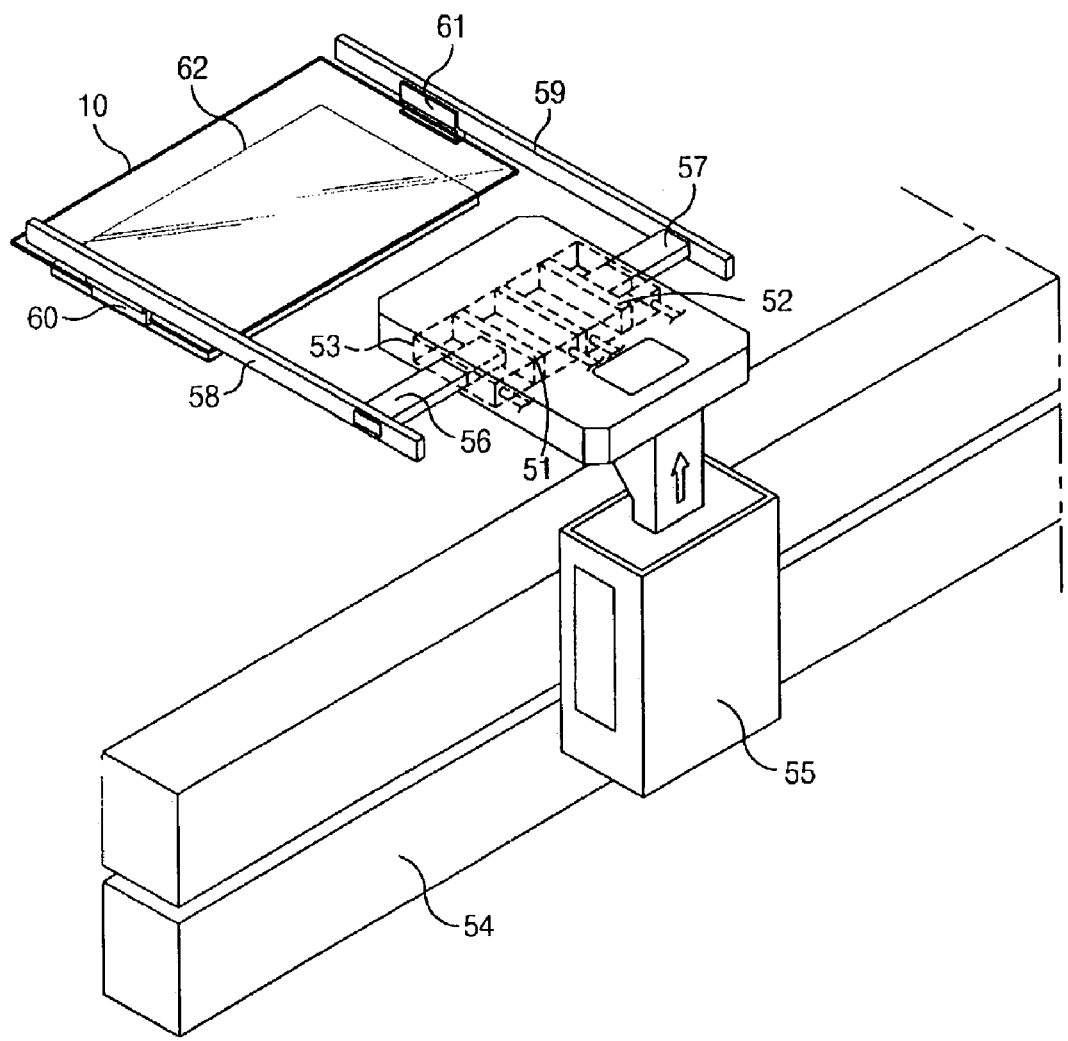
Figure 5:
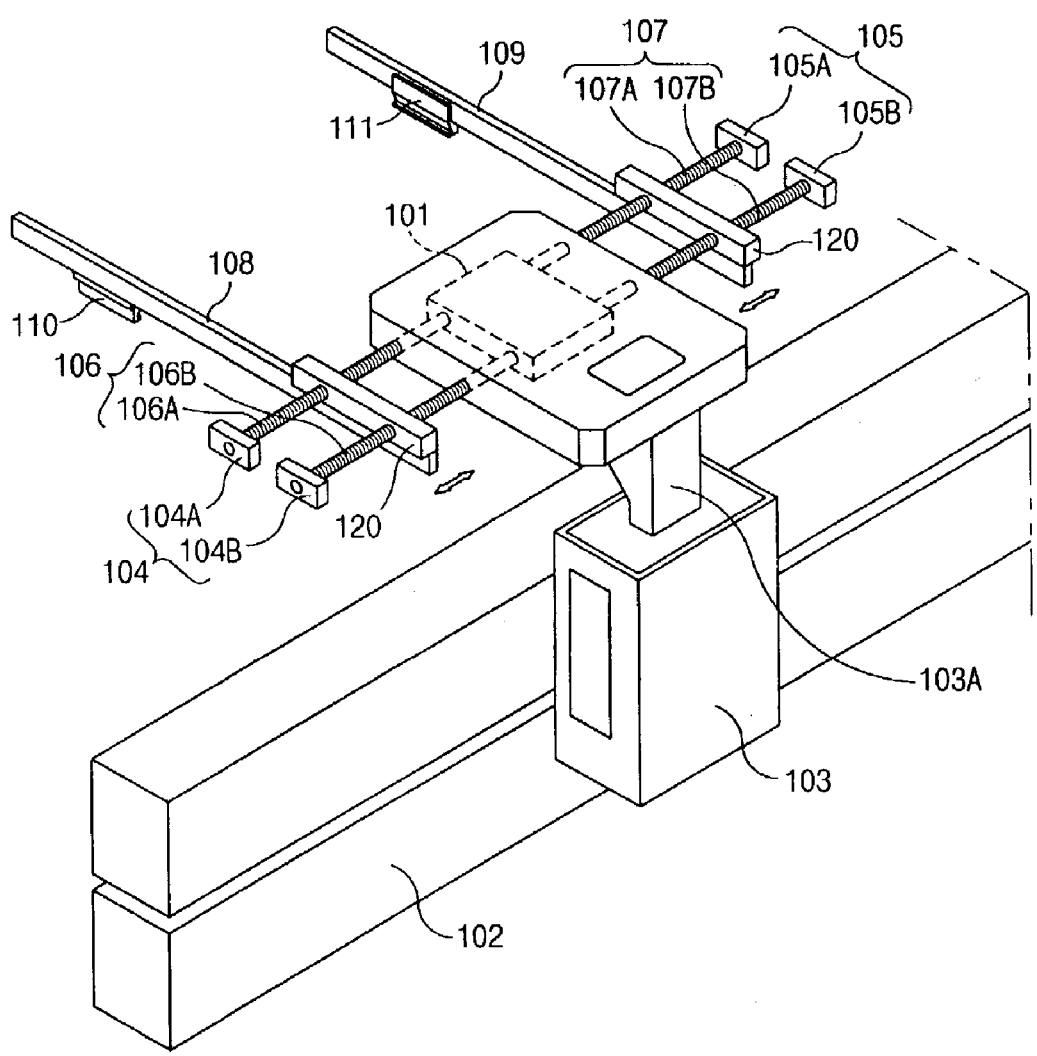
FIG. 5 illustrates a close up view of an apparatus for conveying an individual unit of liquid crystal display panel according to an embodiment of the present invention.

FIG. 5 illustrates a close up view of an apparatus for conveying an individual unit liquid crystal display panel according to an embodiment of the present invention.

Referring to FIG. 5, the embodiment of the present invention, includes a horizontal driving unit 101 for controlling a revolution of a motor (not shown) and a vertical driving unit 103 for driving the horizontal driving unit 101 upward and downward. The driving unit 103 is also driven along a conveying shaft 102. Screw shafts 106 and 107 protrude for lateral sides of the horizontal driving unit 101 and have stoppers 104 and 105 at ends of the screw shafts. A pair of robot arms 108 and 109 has one of their ends supported by the screw shafts 106 and 107, respectively. The robot arms extend from the screw shafts 106 and 107. The robot arms are driven along the screw shafts 106 and 107. For example, revolution of a motor in the horizontal driving unit 101 can move the robot arms in a back and forth direction. Clamping units 110 and 111 are connected to another end of the robot arms 108 and 109. The clamping units protrude into a separating area between the robot arms 108 and 109 at a predetermined length.

The vertical driving unit 103 drives the horizontal driving unit 101 upward and downward via a rod 103A.

The screw shafts 106 and 107 externally protrude from the lateral sides of the horizontal driving unit 101. For example, the screw shafts 106 or 107 may include a pair of screw shafts 106A/106B or 107A/107B. These shafts protrude from their respective lateral side of the horizontal driving unit 101 and are spaced apart at a predetermined interval from each other.

Additionally, a support plate 120 connects the screw shafts 106A and 106B to each other and another support plate 120 connects the screw shafts 107A and 107B to each other. The support plates 120 are arranged to drive along the screw shafts 106A/106B and 107A/107B, respectively. Additionally, the support plates 120 provided effective support for the screw shafts and robot arms and enable the screw shafts to be moved.

Optionally, any number of screw shafts can be utilized. For example, a screw shaft can be arranged on the lateral sides of the horizontal driving unit 101, rather than the screw shafts 106A/106B or 107A/107B.

Figure 6:
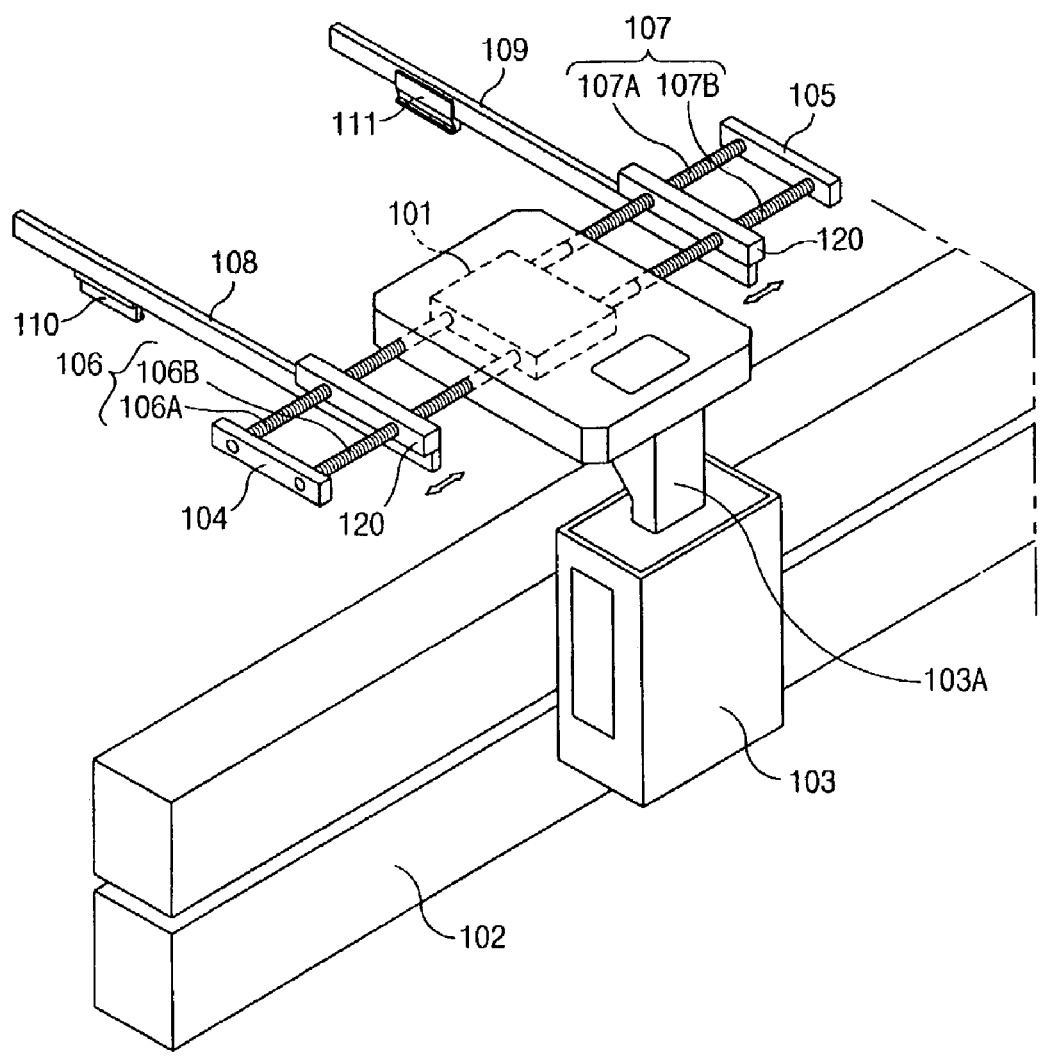
FIG. 6 illustrates a close up view of a stopper.

A pair of the screw shafts 106A/106B and a pair of the screw shafts 107A/107B are included. As shown in FIG. 6, the stopper 104 couples the screw shafts 106A/106B with each other and the other stopper 105 couples the other screw shafts 107A/107B with each other. The stoppers effectively minimize rocking of the screw shafts 106A/106B and 107A/107B.

Figure 7:
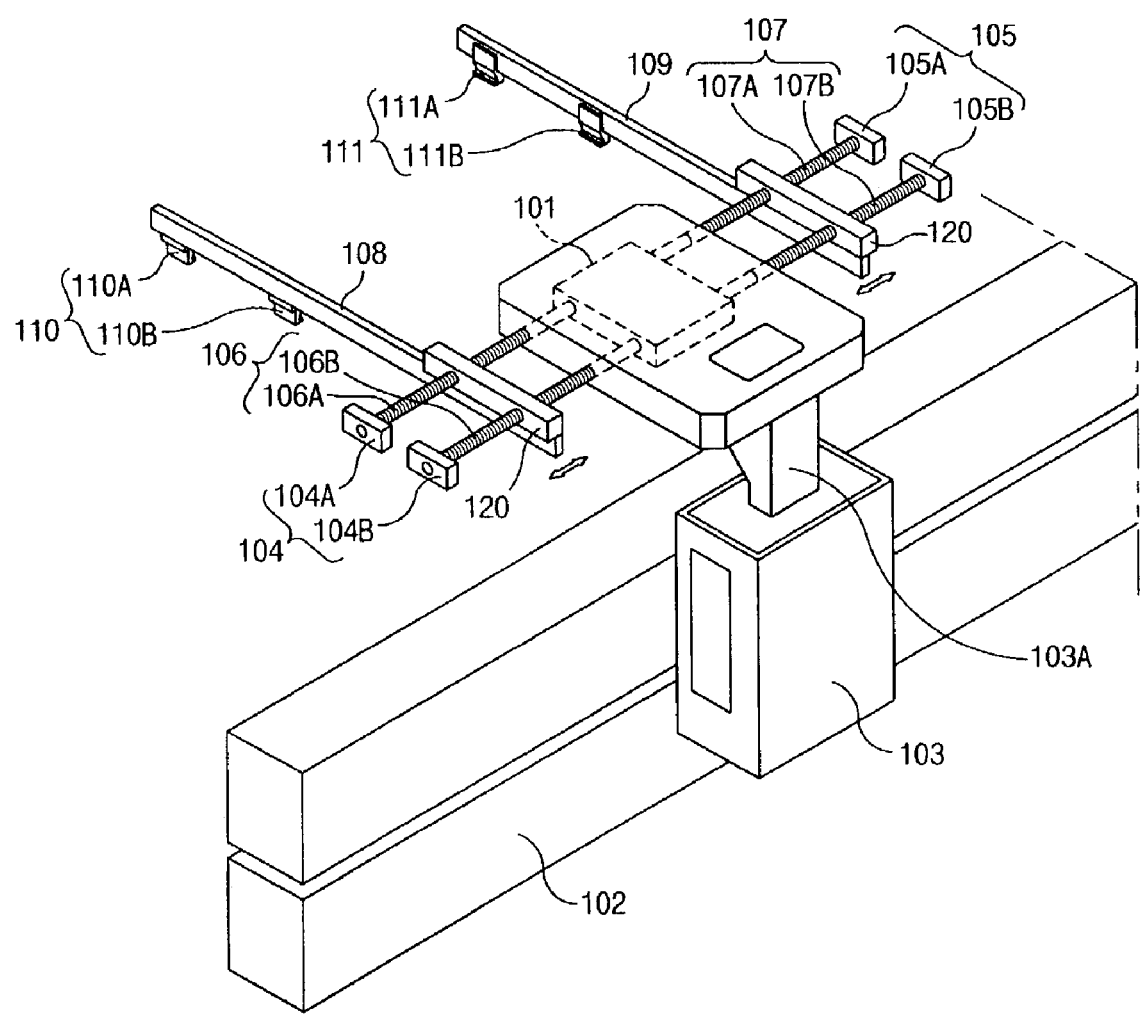
FIG. 7 illustrates a close up view of a clamping.

Clamping units 110 and 111 are connected to the ends of the robot arms 108 and 109. The clamping units may be installed to increase or decrease protruding areas between the robot arms 108 and 109. Optionally, a clamping unit 110, as shown in FIG. 7, may include a pair of clamps 110A and 110B. The clamping unit 110 is separated, thereby leaving a predetermined interval between each other. For example, a pair of clamps 111A and 111B are separated to leave a predetermined interval from each other. The clamping units 110 and 111 may include at least three clamps for securing and providing support to the faces for the liquid crystal display panel.

FIGS. 8A to 8D illustrate a close up views of an apparatus for conveying a unit liquid crystal display panel according to the present invention and will be used for explaining the sequential operation of the apparatus.

Figure 8A:
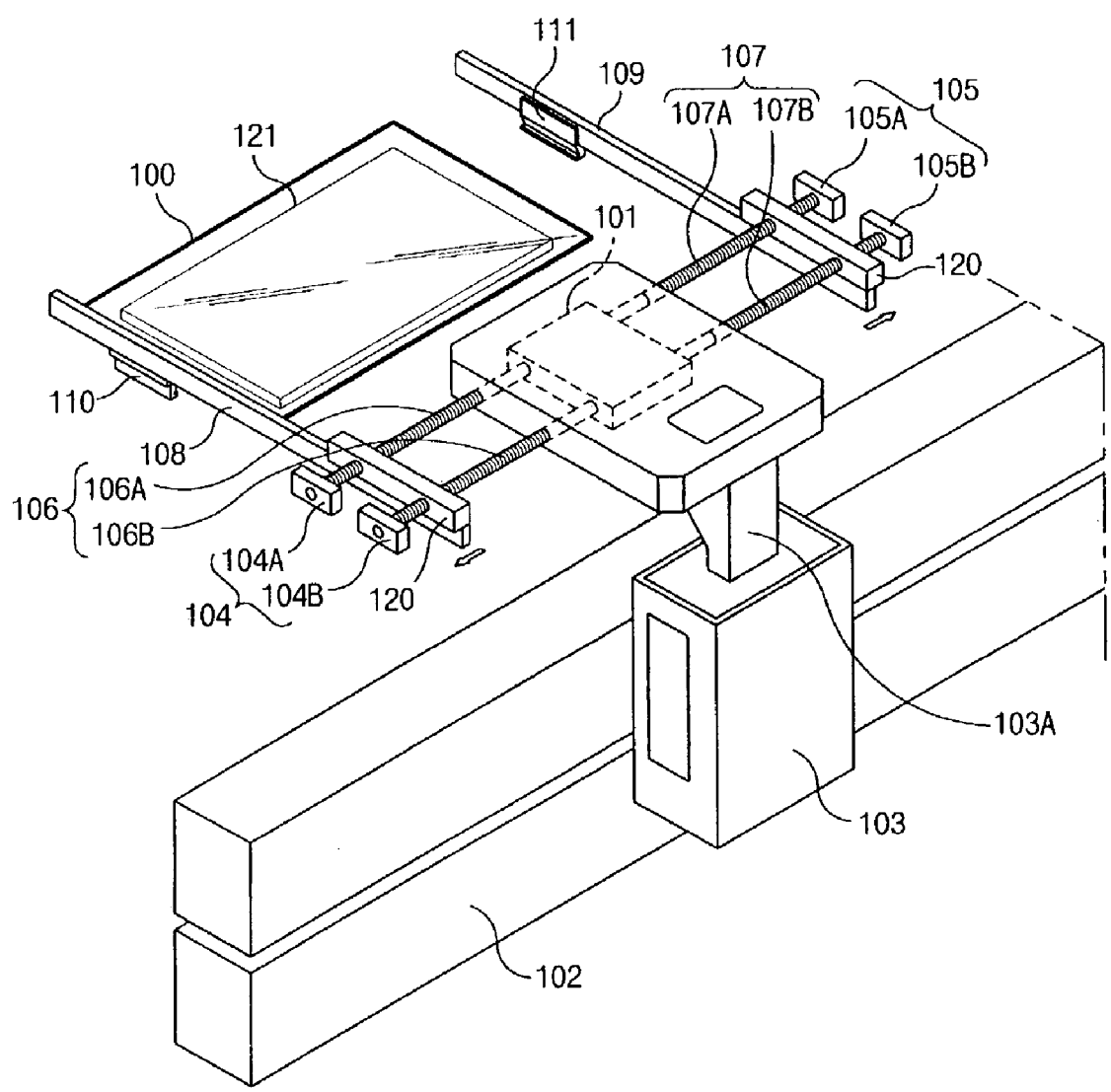
FIGS. 8A to 8D illustrate a close up views of an apparatus for conveying a unit liquid crystal display panel according to the present invention and will be used for explaining the sequential operation of the apparatus.

Referring to FIG. 8A, the horizontal driving unit 101 controls the revolution of the motor inside for driving the support plates 120 connected to the screw shafts 106A/106B and 107A/107B. Robot arms 108 and 109 are connected to the support plates 120. The robot arms are driven in a back and forth direction. For example, the robot arms are driven to leave a predetermined interval from the lateral edges of the unit liquid crystal display panel 100 loaded on a first table 121. In this case, both of the lateral edges of the unit liquid crystal display panel 100 are loaded on the first table 121, the lateral edges protrude longer than the first table 121.

Figure 8B:
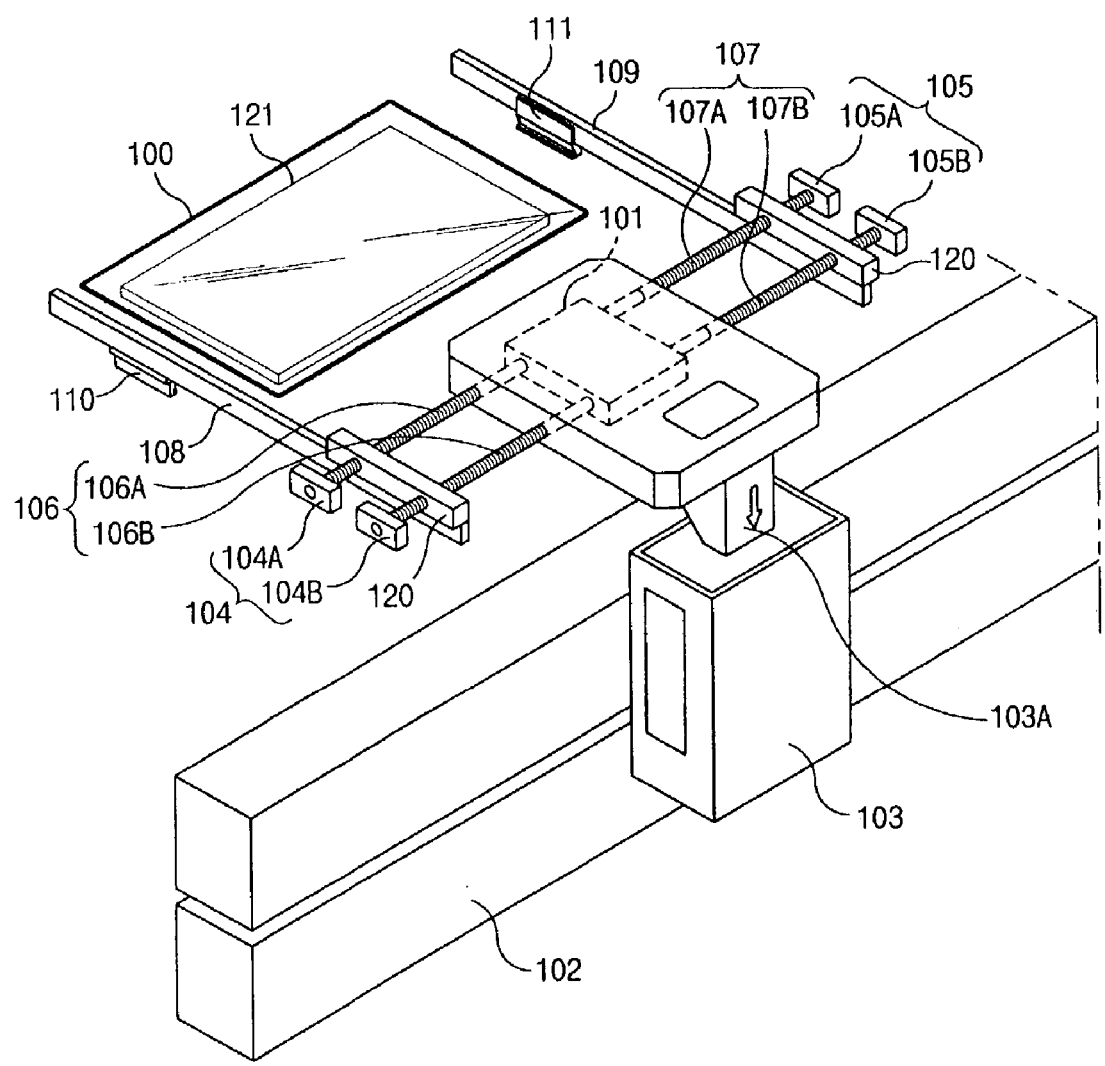

Referring to FIG. 8B, the vertical driving unit 103 lowers the horizontal driving unit 101. The robot arms 108 and 109 are lowered to a level lower than, or to a level at least equal to, that of the unit liquid crystal display panel 100.

Figure 8C:
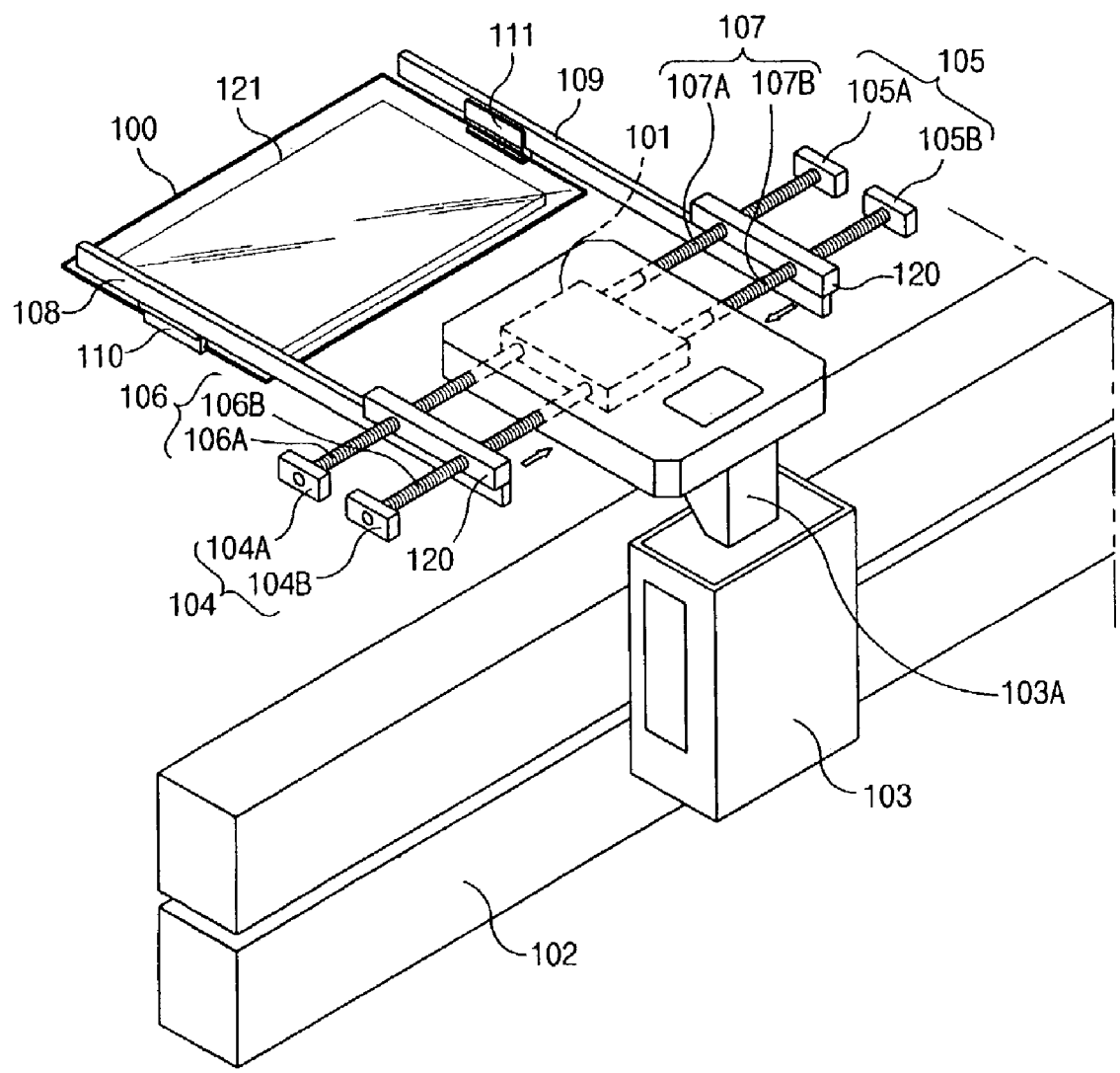

Referring to FIG. 8C, the horizontal driving unit 101 controls the revolution of the motor to drive the support plates 120 and is connected to the screw shafts 106A/106B and 107A/107B. The horizontal drive unit 101 moves the screw shafts 106A/106B and 107A/107B in a direction closer to each other as shown by the arrow. Accordingly, the pair of the robot arms 108 and 109 connected to the support plates 120 are also moved in the direction of the arrow. The robot arms 108 and 109 are closely arranged to both of the lateral edges of the unit liquid crystal display panel 100 loaded on the first table 121.

Figure 8D:
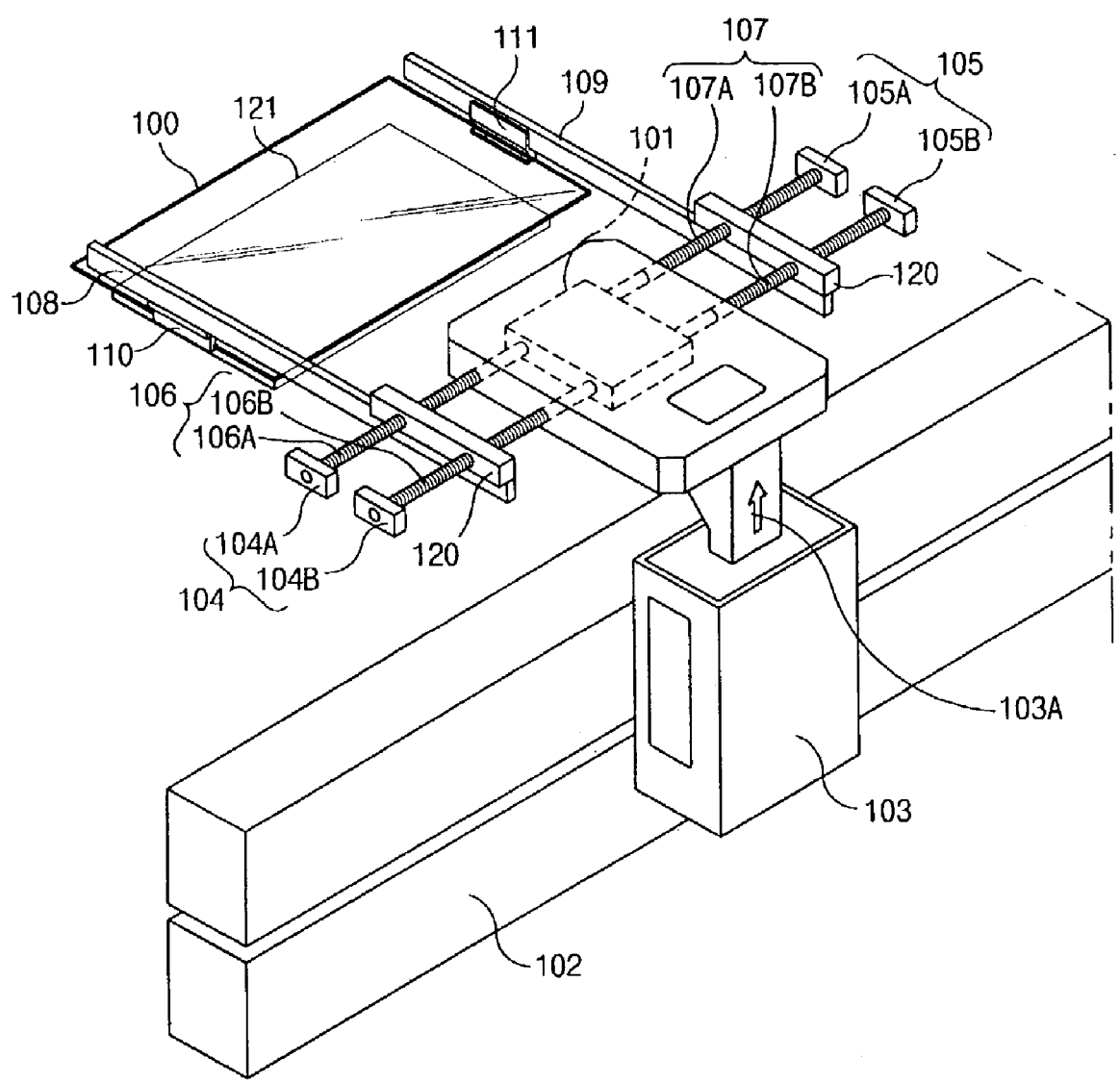

Referring to FIG. 8D, the vertical driving unit 103 elevates the horizontal driving unit 101. Hence, a pair of the robot arms 108 and 109 are lifted and elevate the unit liquid crystal display panel 100 supported by the clamping units 110 and 111 at the ends of the robot arms 108 and 109.

As mentioned in the above description, once the unit liquid crystal display panel 100 is lifted with the robot arms 108 and 109. The vertical driving unit 103 is driven to move along the conveying shaft 102 so that the unit liquid crystal display panel 100 can be transported to the desired location.

After the unit liquid crystal display panel 100 has been conveyed to the desired location. The unit liquid crystal display panel is then arranged on another table in a manner that is reverse to that described with reference to the foregoing FIGS. 8A to 8D.

Accordingly, the apparatus for conveying the liquid crystal display panel according to one embodiment of the present invention varies the interval between the robot arms supported by the screw shafts in accordance with the revolution of the motor, whereby the moving distances of the robot arms are elongates than those of the related art as well as the location of the robot arms can be controlled more precisely.

Therefore, in case that the size of the unit liquid crystal display panel is changed, the present invention copes with the changed size of the unit liquid crystal display panel without exchanging the robot arms.

As the apparatus according to the present invention varies the interval distance between the robot arms by using screw shafts in accordance with the revolution of the motor. Various different size unit liquid crystal display panels can be transported without having to change the robot arms. Accordingly, the present invention is reduces the operation time and improve productive efficiencies.

Additionally, the present invention enables precise control of the robot arm locations, thereby preventing malfunction of the equipments as well as reducing other related product failures.

Finally, a plurality of auxiliary robot arms are not needed to cope with various sizes of the unit liquid crystal display panels. Accordingly, reduction in investment and operating costs are present. Additionally, as additional space is not required for keeping the plurality of the auxiliary robot arms the operating space is minimized.

It will be apparent to those skilled in the art that various modifications and variations can be made in the device for controlling spreading of liquid crystal, and method for fabricating an LCD of the present invention without departing from the spirit or scope of the invention. Thus, it is intended that the present invention cover the modifications and variations of this invention provided they come within the scope of the appended claims and their equivalents.

What is claimed is:

1. An apparatus for conveying a liquid crystal display panel, comprising;
   a horizontal driving unit controlling a revolution of a motor;
   a plurality of screw shafts protruding substantially parallel to each other from lateral sides of the horizontal driving unit at a predetermined distance from each other;
   stoppers at ends of the plurality of screw shafts;
   a pair of robot arms having first and second ends, the first ends are supported by corresponding screw shafts and extend from the screw shafts; and
   a plurality of clamping units connected to the second ends of the robot arms
   wherein the plurality of clamping units are configured to provide support to a face of the liquid crystal display panel.

2. The apparatus of claim 1, further comprising a vertical driving unit connected to the horizontal driving unit with a rod for driving the horizontal driving unit in a vertical direction.

3. The apparatus of claim 1, further comprising support plates connected to the plurality of screw shafts and connected to the robot arms.

4. The apparatus of claim 1, wherein the robot arms are driven by the revolution of the motor.

5. The apparatus of claim 1, wherein the plurality of clamping units include at least two clamps separated from each other at a predetermined distance along a length of the pair of robot arms.

6. The apparatus of claim 1, wherein the stoppers couple the screw shafts with each other.

7. An apparatus for conveying a liquid crystal display panel, comprising;
   a horizontal driving unit controlling a revolution of a motor;
   a plurality of screw shafts protruding substantially parallel to each other from lateral sides of the horizontal driving unit at a predetermined distance from each other;
   stoppers at ends of the plurality of screw shafts;
   a pair of robot arms having first and second ends, the first ends are supported by corresponding screw shafts and extend from the screw shafts; and
   a plurality of clamping units connected to the second ends of the robot arms, the clamping units having at least three clamping units being configured to provide support to a face of the liquid crystal display panel.

8. The apparatus of claim 7, further comprising a vertical driving unit connected to the horizontal driving unit with a rod for driving the horizontal driving unit in a vertical direction; and
   support plates connected to the plurality of screw shafts and connected to the robot arms.

9. The apparatus of claim 7, wherein the robot arms are driven by the revolution of the motor.

10. The apparatus of claim 7, wherein the plurality the clamping units are separated from each other at a predetermined distance along a length of the pair of robot arms.

11. The apparatus of claim 7, wherein the stoppers couple the screw shafts with each other.

12. An apparatus for conveying a liquid crystal display panel, comprising;
    a horizontal driving unit controlling a revolution of a motor;
    a plurality of screw shafts protruding substantially parallel to each other from lateral sides of the horizontal driving unit at a predetermined distance from each other;
    stoppers at ends of the plurality of screw shafts;
    a pair of robot arms having first and second ends, the first ends being supported by corresponding screw shafts, the robot arm being extended from the screw shafts; and
    a plurality of clamping units connected to the second ends of the robot arms, the clamping units having at least three clamping units for providing support to the liquid crystal display panel.

13. The apparatus of claim 12, further comprising a vertical driving unit connected to the horizontal driving unit with a rod for driving the horizontal driving unit in a vertical direction.

14. The apparatus of claim 12, further comprising support plates connected to the plurality of screw shafts and the robot arms.

15. The apparatus of claim 12, wherein the robot arms are driven by the revolution of the motor.

16. The apparatus of claim 12, wherein the robot arms move in an upward direction and a downward direction.

17. The apparatus of claim 12, wherein the stoppers couple the screw shafts with each other.

18. An apparatus for conveying a liquid crystal display panel, comprising;
    a horizontal driving unit controlling a revolution of a motor;
    a plurality of screw shafts protruding substantially parallel to each other from lateral sides of the horizontal driving unit at a predetermined distance from each other;
    stoppers at ends of the plurality of screw shafts;
    a pair of robot arms having first and second ends, the first ends being supported by corresponding screw shafts, the pair of robot arms being extended from the screw shafts and moveable in an upward direction and a downward direction; and
    a plurality of clamping units connected to the second ends of the robot arms.

19. The apparatus of claim 18, further comprising a vertical driving unit connected to the horizontal driving unit with a rod for driving the horizontal driving unit in a vertical direction to move the robot arm.

20. The apparatus of claim 18, further comprising stoppers at ends of the plurality of screw shafts.

21. The apparatus of claim 18, wherein the robot arms are driven by the revolution of the motor.

22. The apparatus of claim 18, wherein the plurality of clamping units include at least two clamps separated from each other at a predetermined distance along a length of the pair of robot arms.

23. The apparatus of claim 18, wherein the stoppers couple the screw shafts with each other.

* * * * *